(12) United States Patent
Aihara

(10) Patent No.: US 6,788,090 B2
(45) Date of Patent: Sep. 7, 2004

(54) METHOD AND APPARATUS FOR INSPECTING SEMICONDUCTOR DEVICE

(75) Inventor: Tomoaki Aihara, Tokyo (JP)

(73) Assignees: NEC Corporation (JP); NEC Electronics Corporation (JP)

( * ) Notice: Subject to any disclaimer, the term of this patent is extended or adjusted under 35 U.S.C. 154(b) by 0 days.

(21) Appl. No.: 09/832,666

(22) Filed: Apr. 11, 2001

(65) Prior Publication Data
US 2001/0030553 A1 Oct. 18, 2001

(30) Foreign Application Priority Data
Apr. 14, 2000 (JP) ........................................ 2000-114045

(51) Int. Cl.[7] .............................................. G01R 31/26
(52) U.S. Cl. .................................. 324/765; 324/158.1
(58) Field of Search ............................. 324/765, 158.1, 324/754, 763, 72.5, 73.1; 714/724, 719, 720; 333/33, 127, 172; 365/201; 439/66, 482

(56) References Cited
U.S. PATENT DOCUMENTS

| | | | | |
|---|---|---|---|---|
| 4,267,538 A | * | 5/1981 | Assal et al. ................. 333/33 |
| 5,086,271 A | * | 2/1992 | Haill et al. ............... 324/158.1 |
| 5,172,051 A | * | 12/1992 | Zamborelli ................. 324/72.5 |
| 5,656,979 A | * | 8/1997 | Nishimura ................... 333/127 |
| 5,760,599 A | * | 6/1998 | Ehiro ......................... 324/765 |
| 5,880,540 A | * | 3/1999 | Bessho et al. ............. 307/131 |
| 6,140,885 A | * | 10/2000 | Abadeer et al. .............. 333/33 |
| 6,218,910 B1 | * | 4/2001 | Miller ......................... 333/33 |
| 6,297,659 B1 | * | 10/2001 | Saito ......................... 324/765 |
| 6,339,338 B1 | * | 1/2002 | Eldridge et al. ............ 324/765 |

FOREIGN PATENT DOCUMENTS
JP    11-231022    8/1999

* cited by examiner

Primary Examiner—Kamand Cuneo
Assistant Examiner—Jimmy Nguyen
(74) Attorney, Agent, or Firm—Dickstein, Shapiro, Morin & Oshinsky, LLP.

(57) ABSTRACT

An inspection apparatus by which an increased number of semiconductor devices can be inspected simultaneously. The inspection apparatus includes a driver for outputting a signal to be used for inspection, a branching point to which the output terminal of the driver is connected, a current limiting element interposed between each of the terminals of the semiconductor devices to be inspected and the branching point, and a capacitor connected in parallel to each of the current limiting elements. A resistor or a thermistor, for example, is used for the current limiting element.

29 Claims, 7 Drawing Sheets

METHOD AND APPARATUS FOR INSPECTING SEMICONDUCTOR DEVICE

BACKGROUND OF THE INVENTION

1. Field of the Invention

The present invention relates to a method of and an apparatus for inspecting semiconductor devices such as semiconductor integrated circuits and semiconductor memory devices, and more particularly to an inspection method and an inspection apparatus for semiconductor devices by which an increased number of semiconductor devices can be inspected simultaneously.

2. Description of the Related Art

When a semiconductor device is inspected upon manufacture or delivery, usually a semiconductor tester and the semiconductor device to be inspected are connected to each other through a probe card or a test board. Then, a predetermined inspection signal is applied to each pad or each pin for an input signal of the semiconductor device under the inspection, and a signal at each pad or each pin for an output signal of the semiconductor device then is detected. A semiconductor device of the inspection object may be referred to also as DUT (Device Under Test).

In the field of semiconductor devices, a terminology is sometimes used in different manners depending upon whether a semiconductor device is not packaged as yet or is packaged already in such a manner that, for the semiconductor device before packaged, a representation "to connect to a pad with a probe card used" is used, but for the semiconductor device after packaged, another representation "to connect to a pin with a test board" is used. In the following description, however, pads and pins of semiconductor devices are generally referred to as terminals. Also the probe card for connecting a semiconductor device of the inspection object to a tester is used to include a test board.

In inspection of a semiconductor device, it is requested to minimize the inspection time. To this end, it has been attempted to inspect a plurality of semiconductor devices simultaneously. FIG. 1 shows a basic configuration for inspecting a plurality of semiconductor devices simultaneously with a single tester used.

Tester 61 for inspecting semiconductor devices in accordance with a test program includes a plurality of drivers 62 each for applying a predetermined signal to a terminal 65 for an input signal of semiconductor device 64 to be inspected. Each of semiconductor devices 64 has a plurality of terminals 65 each for an input signal. Tester 61 and semiconductor devices 64 are connected to each other through probe card 63. One driver 62 in tester 61 corresponds to one terminal 65, and therefore, a number of drivers 62 greater than the total number of input terminals 65 of the semiconductor devices 64 to be inspected are prepared.

After all, in the configuration described above, a number of drivers equal to the total number of terminals for an input signal of semiconductor devices to be inspected simultaneously must be prepared in the tester. Therefore, the configuration described has a problem in that the tester has a large-scale configuration. Further, the number of the drivers that are provided in the tester limits the number of semiconductor devices that can be inspected simultaneously. Therefore, the configuration has another problem in that the number of simultaneously inspected semiconductor devices cannot be increased very much.

It is generally considered that semiconductor devices that are inspected simultaneously are of the same type. Thus, Japanese Patent Laid-Open No. 11-231022 (JP, 11231022, A) discloses an apparatus wherein a signal from a driver of a tester is branched in a probe card and supplied in parallel to a plurality of semiconductor devices to be inspected simultaneously as seen from FIG. 2. A wiring scheme by which a signal from a driver is branched and supplied in parallel to a plurality of semiconductor devices is called common drive wiring, and a driver used in such common drive wiring is called a common driver.

In the configuration shown in FIG. 2, three terminals 65a to 65c, and 65d to 65f for an input signal are respectively provided for each of a plurality of semiconductor devices 64a, 64b. The output of driver 62a from among the drivers in tester 61 is connected to terminal 65a of semiconductor device 64a, and the output of driver 62d is connected to terminal 65d of another semiconductor device 64b. However, the output of driver 62b is branched at branching point 66a in probe card 63 and supplied to terminal 65e of semiconductor device 64b. Similarly, the output of driver 62c is branched at branching point 66b in probe card 63 and supplied to terminal 65c of semiconductor device 64a and terminal 65f of semiconductor device 64b. Since the output of each of drivers 62b, 62c is branched and connected to a plurality of terminals for an input signal, drivers 62b, 62c are common drivers.

Such a configuration as described above includes a driver that takes charge of a plurality of terminals and therefore allows a greater number of semiconductor devices to be inspected with a small number of drivers used.

This configuration, however, has a problem in that, if one of semiconductor devices inspected simultaneously has a defect such as leak or a short-circuit at an input terminal, inspection of the remaining normal semiconductor devices is disabled. Where the input terminal of a semiconductor device to be inspected has a MOS (metal-oxide-semiconductor) transistor configuration or a CMOS (complementary MOS) configuration, it is considered that the input resistance of the input terminal is equal to or higher than 0.5 MΩ, typically equal to or higher than approximately 3 MΩ. Therefore, the drivers in a tester are so configured that the current driving capacity thereof may conform to the input resistance. Here, if leak of 100 Ω or less when converted into an input resistance for dc, for example, occurs with one of a plurality of input terminals to which a signal branched from a driver is applied, then a normal signal voltage is not applied to the normal input terminals either. This disables inspection of a normal semiconductor device as well.

This is described in connection with the example shown in FIG. 2. It is assumed here that semiconductor device 64a is a non-defective unit and semiconductor device 64b is a defective unit in that leak occurs with input terminal 65e thereof. Terminal 65e with which leak occurs and terminal 65b of semiconductor device 64a of a non-defective unit are connected in parallel to driver 62b. Therefore, when terminals 65b, 65e are driven by driver 62b, because of the leak at terminal 65e, a regular signal voltage is not applied to normal terminal 65b either, and also semiconductor device 64a of a non-defective unit cannot be inspected normally.

As a countermeasure to solve the problem described above where a signal from a driver is branched and applied to a plurality of input terminals, it is attempted to insert a resistor of approximately several hundreds ohms between a branching point and each input terminal after a signal from a driver is branched in a probe card as seen in FIG. 3. The configuration shown in FIG. 3 is a modification to the configuration shown in FIG. 2 in that resistors 67 of approximately several hundreds ohms (600 Ω, for example) are inserted between branching point 66a and terminal 65b, between branching point 66a and terminal 65e, between branching point 66b and terminal 65c, and between branching point 66b and terminal 65f.

Although this configuration is effective for inspection of a semiconductor device whose clock frequency is comparatively low such as approximately 10 MHz or less, it cannot be used for inspection of a semiconductor device whose clock frequency is higher than 30 MHz. The reason is that, since the input capacitance of each input terminal of a semiconductor device to be inspected is typically 5 pF and provides a time constant of approximately 3 ns together with the inserted register (typically having a resistance of approximately 600 Ω), the application timing of the signal to the input terminals is delayed as much and the waveform of the signal applied thereto is distorted. Further, the dispersion in input capacitance disperses the delay time itself for each terminal.

Also with the circuit configuration shown in FIG. 2 or FIG. 3, a signal to which a delay or distortion of the waveform is extremely unfavorable like a reference clock which determines an operation timing of a semiconductor device is supplied to a clock input terminal without being branched from a driver. If some delay occurs with a certain data input terminal as described above, the signal is not latched correctly at the data input terminal when the latch operation is synchronized to the clock signal supplied to the clock input signal. Further, extreme distortion of a signal renders operation of the semiconductor device unstable as well.

FIG. 4 is a diagram illustrating a disadvantage where a waveform suffers from some delay or distortion. Waveform b is a waveform to be latched at a rising edge of waveform a, and it is assumed here that waveform b falls prior to a rising edge of waveform a. Also it is assumed that a resistor is interposed between the driver that outputs waveform b and a terminal of a semiconductor device to be inspected to which waveform b is inputted. Furthermore, it is assumed that the threshold voltage of the latch is just equal to one half power supply voltage Vcc, and consequently, it is discriminated that the input voltage has the "H" (high) level when it is equal to or higher than Vcc/2, but the input voltage has the "L" (low) level when it is lower than Vcc/2. The solid line curve of waveform b indicates a waveform when no resister is interposed (i.e., waveform at the output point of the driver) and a broken line indicates a waveform at the input terminal of the semiconductor device when the resistor is inserted as seen in FIG. 3. As seen from FIG. 4, where a resistor is connected to the driver which outputs waveform b, waveform b still remains at the "H" level at the point of time of the rising edge of waveform a, and therefore, the semiconductor device cannot latch a signal correctly.

In recent years, the clock frequency of a semiconductor memory device, for example, has raised from 66 MHz to 100 MHz and further to 250 MHz, and utilization also of a higher clock frequency is proceeding steadily. Also the bus frequency of a microprocessor has been and is raised similarly. Thus, the delay caused by an inserted resistor restricts the number of simultaneously inspected semiconductor devices of the type described and significantly disturbs augmentation in efficiency of the inspection.

With the conventional inspection methods described above, as the operation speed of a semiconductor device increases, it becomes more difficult to increase the number of semiconductor devices which can be inspected simultaneously without increasing the required number of drivers in a tester while a defect of one of semiconductor devices inspected simultaneously is prevented from having a bad influence on the other normal semiconductor devices.

SUMMARY OF THE INVENTION

It is an object of the present invention to provide an inspection method for a semiconductor device by which an increased number of semiconductor devices can be inspected simultaneously without increasing the number of drivers in a tester even where the semiconductor devices of the inspection object are of the type which operates at a high speed.

It is an object of the present invention to provide an inspection apparatus for a semiconductor device by which an increased number of semiconductor devices can be inspected simultaneously without increasing the number of drivers in a tester even where the semiconductor devices of the inspection object are of the type which operates at a high speed.

In the present invention, when a common drive wiring line is used to branch a signal from a driver so that the signal is supplied in parallel to a plurality of input terminals through respective resisters, a capacitor is connected in parallel to each resistor. This simple circuit configuration wherein a capacitor is connected in this manner can suppress delay or distortion of a signal applied to the input terminal even where a resistor is inserted in the common drive wiring line. As a result, a large number of semiconductor devices whose clock frequency is higher than 30 MHz can be inspected simultaneously.

The resistor is used to prevent a defect like a leak defect, which may incidentally occur with one of semiconductor devices connected to the common drive wiring line, from having an influence on the other semiconductor devices, and acts to suppress overcurrent which may flow due to such leak defect. Accordingly, in the present invention, the resistor may be replaced by any current limiting element such as a thermistor having a positive temperature coefficient or a constant current element which makes use of a threshold value-current characteristic of a junction field effect transistor (JFET), for example. Also a resistor is included in the criterion of the current limiting element in the present invention.

Where a resistor is used as the current limiting element, the resistance value of the resistor is determined suitably in accordance with the dc input resistance value or the input capacitance value of the input terminal of the semiconductor device to be inspected. However, where the input terminals of the semiconductor device have a MOS transistor configuration or a CMOS configuration, for example, and have a dc input resistance value equal to or higher than 3 MΩ, the resistance value of the resistor is set within the range from 50 Ω to 1 kΩ, more preferably within the range from 50 Ω to 200 Ω.

Meanwhile, preferably the capacitance value of the capacitor connected in parallel to the resistor is equal to or higher than the input capacitance of each input terminal of the semiconductor device to be inspected. More strictly, the capacitance value of the capacitor preferably is equal to or higher than an input capacitance value (a designed value or a value on a catalogue, for example) of the input terminal to be connected thereto when the terminal is normal, and more preferably is equal to or higher than 1.5 times the input capacitance value. Since the input terminals of a MOS transistor configuration or a CMOS configuration usually have an input capacitance value of 3 to 5 pF although they have somewhat different input capacitance values before and after the semiconductor device is packaged, the capacitance value of the capacitor connected in parallel to the resistor preferably is equal to or higher than 5 pF, more preferably is equal to or higher than 7 pF, and further more preferably is equal to or higher than 10 pF. However, if the capacitance value is excessively high, then the volume of the capacitor may be so large that it may possibly be difficult to accommodate a required number of capacitors in a probe card or a test board. Further, where leak current at an input terminal of a semiconductor device of the inspection object is very large due to a defect, this unfavorably provides a capacitive load to the driver of the tester. The upper limit to the capacitance value of the capacitor preferably is equal to or lower than 10 times the input capacitance, for example, and more preferably is equal to or lower than 50 pF.

In the present invention, it is possible to use an element having a variable resistance value as the resistor or current limiting element. Further, it is possible to use an element having a variable capacitance value as the capacitor that is connected in parallel to the resistor or current limiting element. Use of such a variable resistor and/or a variable capacitor allows selection of an optimum resistance value and/or an optimum capacitance value in accordance with an electric characteristic of the input terminals of the semiconductor device to be inspected, a clock frequency or the driving capacity of the driver.

In the present invention, the number of branches from one driver in the tester by the common drive wiring line is not limited to 2 but is adjusted suitably in accordance with the number of semiconductor devices to be inspected simultaneously or with some other parameter. The number of branches may be three, four or more, for example.

The semiconductor device to which the present invention can be applied suitably is a semiconductor device such as a semiconductor memory device, a microprocessor or an ASIC (application specific integrated circuit) whose driving clock or reference clock has a frequency equal to or higher than 10 MHz, typically equal to or higher than 50 MHz. A semiconductor memory device, a microprocessor or an ASIC whose reference clock has one of frequencies of 66 MHz, 100 MHz and 133 MHz, for example, is applicable to this. The driving clock or the reference clock here signifies a clock signal that is supplied as a reference to a timing for fetching or outputting of a signal to the semiconductor device. According to the present invention, a plurality of semiconductor devices can be inspected simultaneously through the common drive wiring line even where the clock frequency for the semiconductor devices is 250 MHz, for example.

Furthermore, the present invention is suitably applied also to a semiconductor device for which it is required that the rise time or the fall time of a signal is equal to or shorter than 10 ns, typically equal to or shorter than 5 ns. The time required for an input voltage to rise from its 10% value to its 90% value is called rise time and the time required for an input voltage to fall from its 90% value to its 10% value is called fall time in accordance with a common custom in the pertaining field.

The above and other objects, features, and advantages of the present invention will become apparent from the following description referring to the accompanying drawings which illustrate examples of preferred embodiments of the present invention.

DESCRIPTION OF THE PREFERRED EMBODIMENTS

Figure 5:
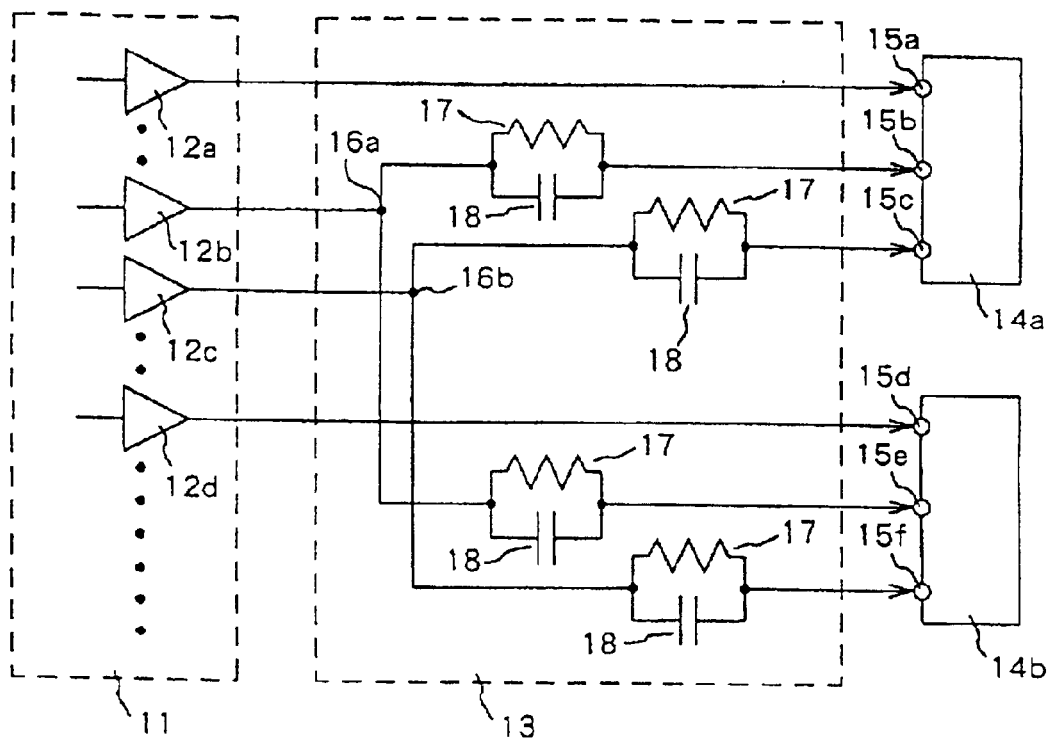
FIG. 5 is a circuit diagram showing a configuration of a semiconductor device inspection apparatus of a preferred embodiment of the present invention.

It is assumed that, in FIG. 5 which shows a configuration of a semiconductor device inspection apparatus of a preferred embodiment of the present invention, tester 11 is used to inspect two semiconductor devices 14a, 14b simultaneously, for the convenience of description. Each of semiconductor devices 14a, 14b includes three inputting terminals 15a to 15c, 15d to 15f. Tester 11 includes a plurality of drivers 12a, 12b, 12c, 12d, ..., and signals from the drivers are applied to semiconductor devices 14a, 14b through probe card 13.

The output of driver 12a is connected one by one to terminal 15a of semiconductor device 14a, and also the output of driver 12d is connected to terminal 15d of semiconductor device 14b. Therefore, the wiring lines for them are not common drive wiring lines.

On the other hand, the output of driver 12b is branched to two branches at branching point 16a in probe card 13, and one of the branches is connected to inputting terminal 15b of semiconductor device 14a while the other branch is connected to inputting terminal 15e of semiconductor device 14b. Resistor 17 is interposed between branching point 16a and terminal 15b. Further, capacitor 18 is connected in parallel to resistor 17. Similarly, resistor 17 is interposed between branching point 16a and terminal 15e, and capacitor 18 is connected in parallel to resistor 17. In other words, the output of driver 12b is connected to a common drive wiring line. Resistors 17 and capacitors 18 are provided in probe card 13.

Also the output of driver 12c is branched to two branches at branching point 16b in probe card 13 and is connected to a common drive wiring line similarly to the output of driver 12b. In particular, resistor 17 is interposed between branching point 16b and terminal 15c, and capacitor 18 is connected in parallel to resistor 17. Resistor 17 is interposed between branching point 16b and terminal 15f as well, and capacitor 18 is connected in parallel to resistor 17.

Each of inputting terminals 15a to 15f has a dc input resistance value of 3 MΩ, for example, and has an input capacitance of 3 pF. In this instance, a resistor of 100 Ω, for example, is used for each resistor 17, and a capacitor of a capacitance of 10 pF is used for each capacitor 18.

In the example shown in FIG. 5, the common driven wiring is applied to terminals 15b, 15c, 15e, 15f from among the input terminals of semiconductor devices 14a, 14b, but is not applied to the remaining terminals 15a, 15d.

Those terminals to which the common drive wiring is applied and those terminals to which the common drive wiring is not applied are present in a mixed state in this manner, and they may be applied separately in the following manner. Where the semiconductor device of the inspection object is a semiconductor memory device such as a DRAM (Dynamic Random Access Memory), for example, a clock signal is used as a reference to operation of the memory device and accordingly provides a reference to the timing upon inspection. Further, the clock signal is frequently prescribed strictly in terms of the duty ratio and the waveform. Accordingly, generally the common drive wiring is not applied to the clock signal. On the other hand, preferably the common drive wiring is applied to an address line, data line, a CAS (column address strobe) signal and a RAS (row address strobe) signal which are fetched in synchronism with the clock signal so that the required number of drivers in the tester may be decreased. Such criteria as described here can be applied also where the semiconductor device of the inspection object is a microprocessor.

Figure 1:
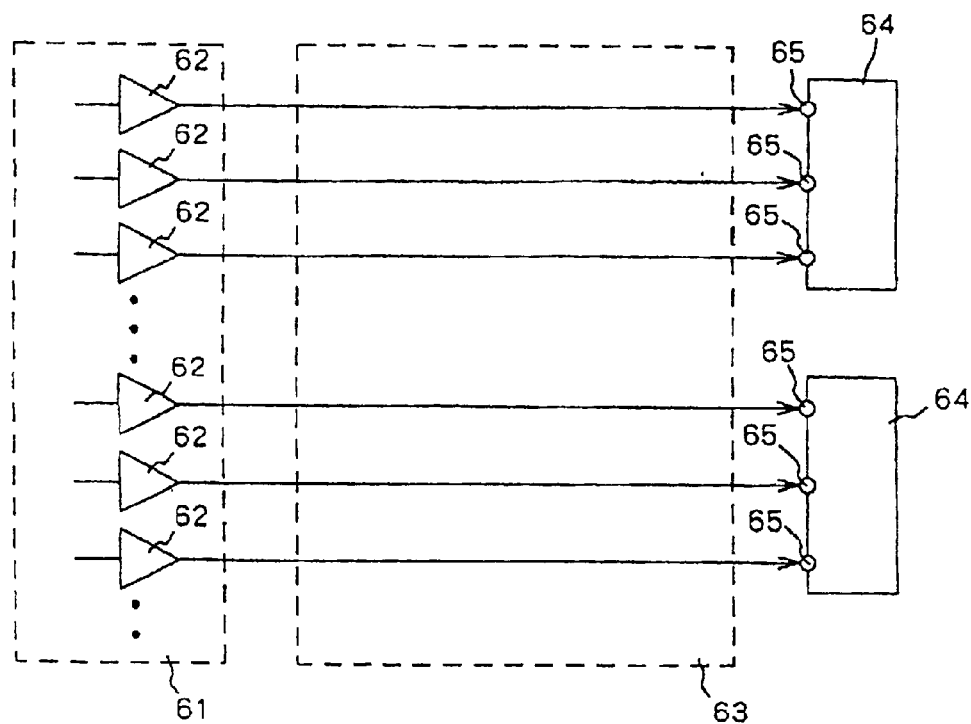
FIG. 1 is a circuit diagram illustrating an example of conventional inspection method for a semiconductor device.
Figure 2:
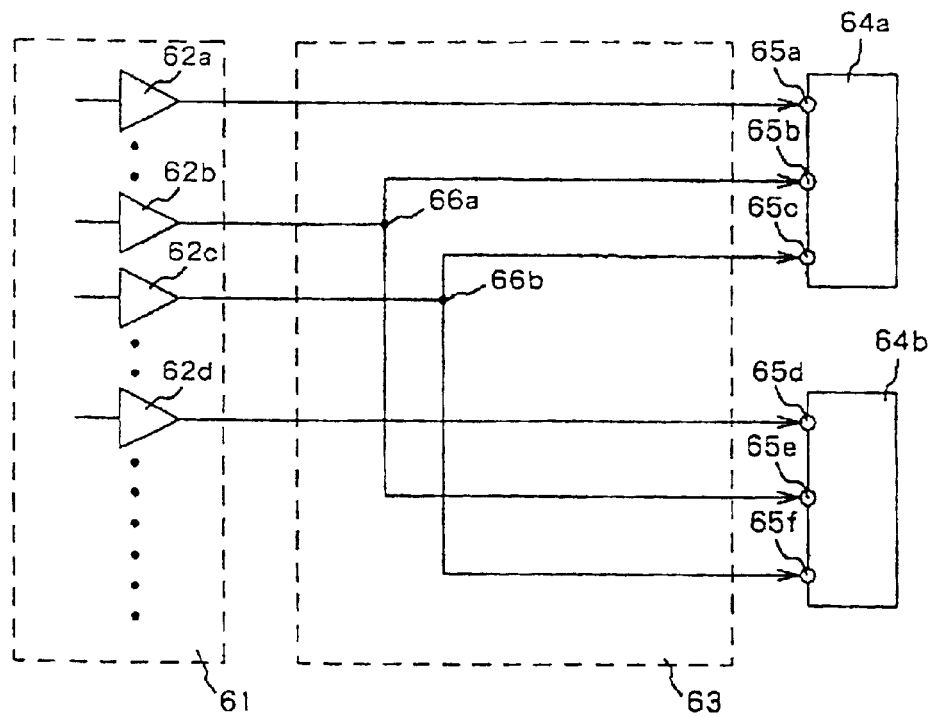
FIG. 2 is a circuit diagram illustrating another example of conventional inspection method for a semiconductor device.
Figure 3:
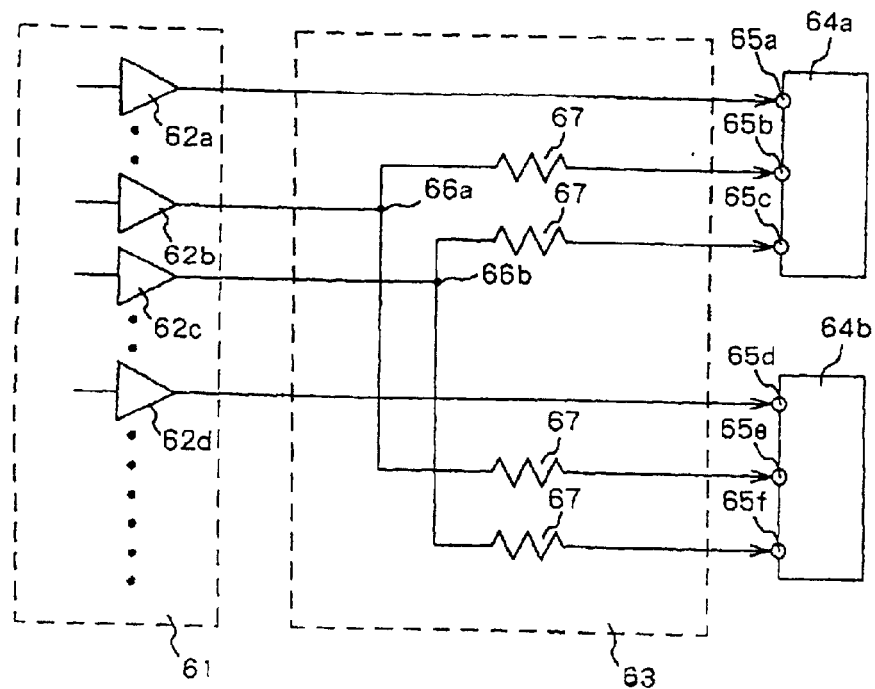
FIG. 3 is a circuit diagram illustrating a further example of conventional inspection method for a semiconductor device.
Figure 4:
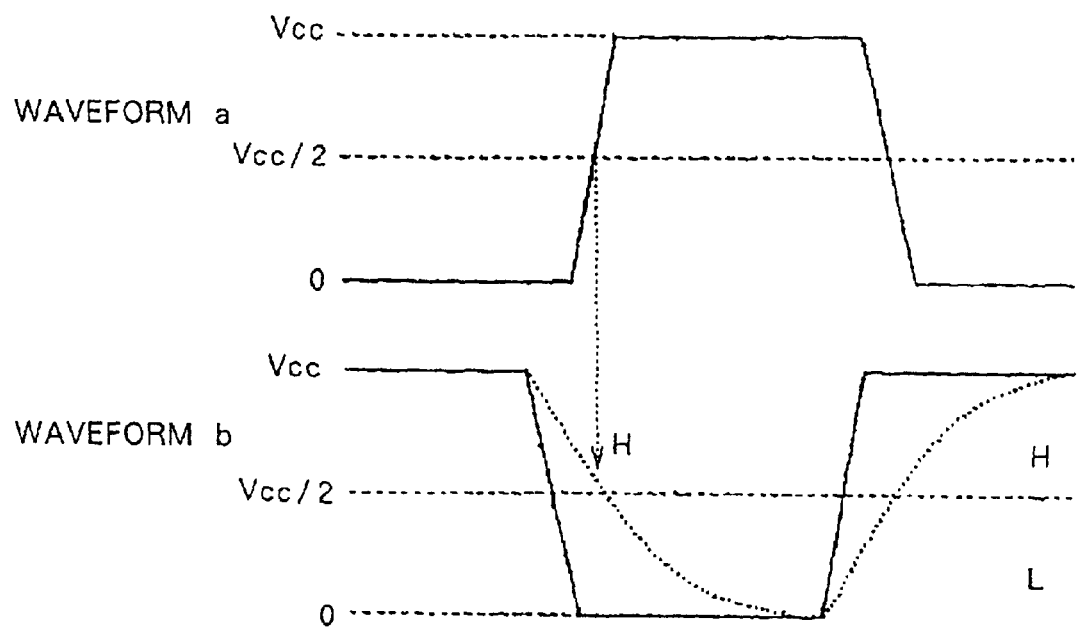
FIG. 4 is a diagram showing waveforms in the configuration shown in FIG. 3.
Figure 6A:
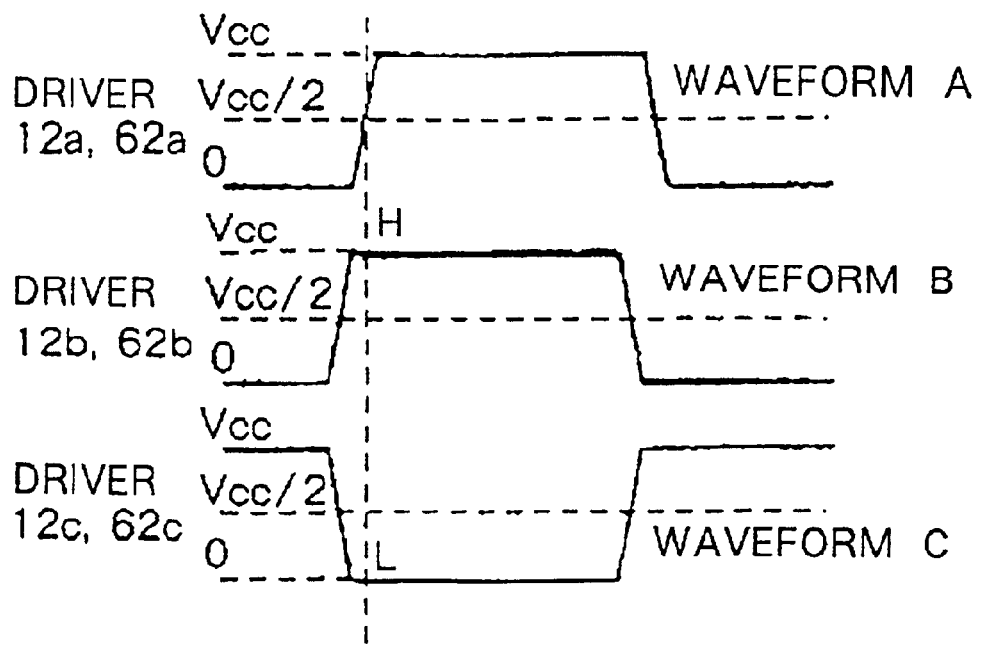
FIG. 6A is a diagram showing waveforms outputted from drivers.
Figure 6B:
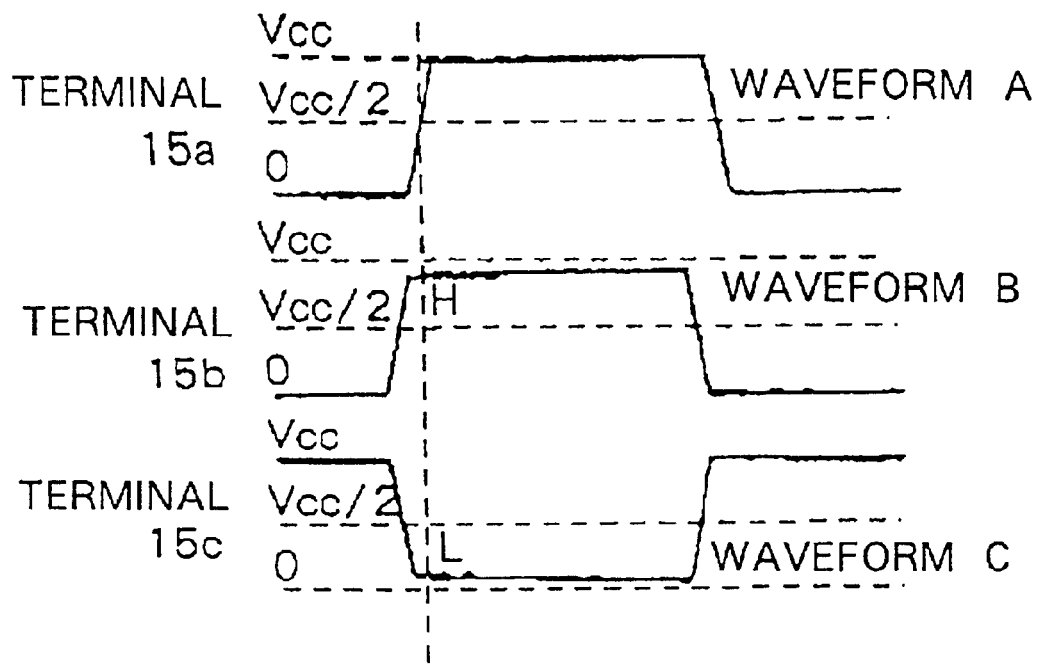
FIGS. 6B and 6C are diagrams showing waveforms applied to different input terminals of a semiconductor device in the arrangement shown in FIG. 5.
Figure 6C:
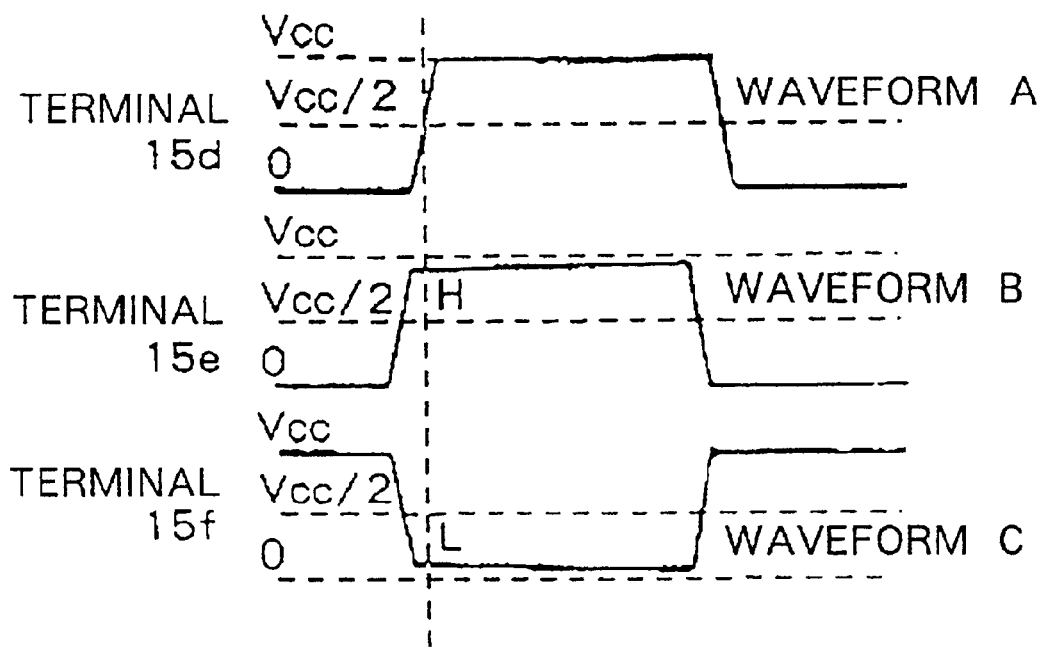
Figure 6D:
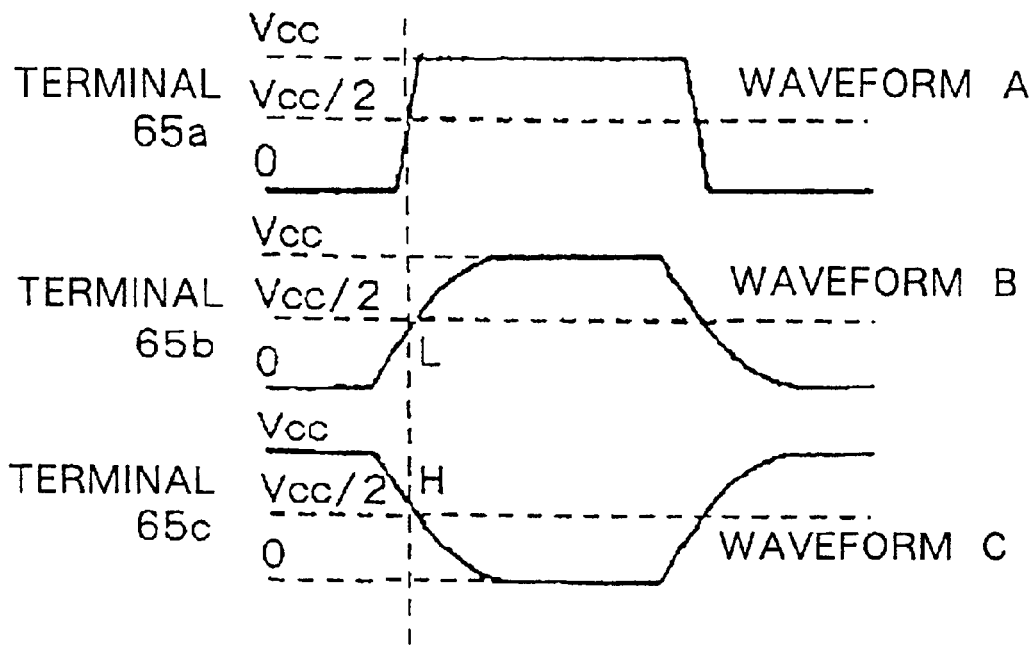
FIGS. 6D and 6E are diagrams showing waveforms applied to different input terminals of a semiconductor device having the conventional configuration shown in FIG. 3.
Figure 6E:
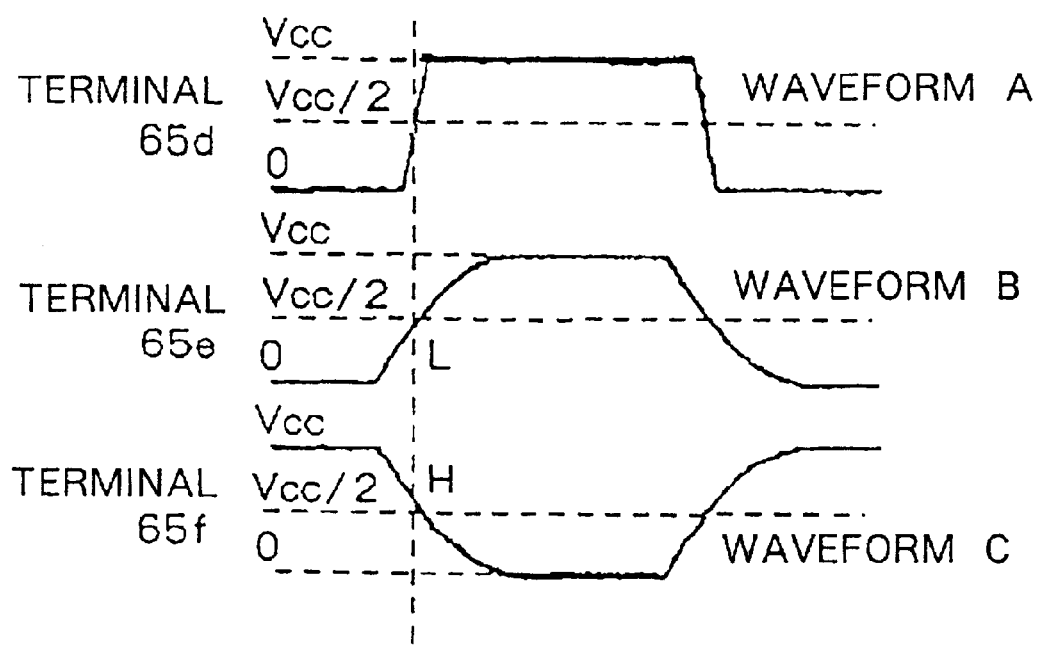

FIGS. 6A to 6E are diagrams for comparison between waveforms at different portions of the configuration of the present embodiment and waveforms at different portions of the conventional configuration shown in FIG. 3. FIG. 6A shows standard signals, i.e., the output waveforms of the drivers. FIGS. 6B and 6C show waveforms at input terminals 15a to 15f of the configuration shown in FIG. 5 when the signals illustrated in FIG. 6A are outputted from the drivers. Meanwhile, FIGS. 6D and 6E show waveforms at input terminals 65a to 65f of the conventional configuration shown in FIG. 3, that is, the configuration wherein only resisters are inserted in a common drive wiring line when the signals illustrated in FIG. 6A are outputted from the drivers.

Here, the input capacitance of each input terminals of the semiconductor device to be inspected is 5 pF; the input resistance of each input terminal is 3 MΩ; the resistance value of each resistor inserted in the common drive wiring lines is 300 Ω; and the capacitance of each capacitor connected in parallel to the resistor is 50 pF.

As seen in FIG. 6A, waveform A outputted from driver 12a (62a) is a pulse of the pulse width of 15 ns; waveform B outputted from driver 12b (62b) is a pulse which rises earlier by 1 ns than a rising edge of waveform A; and waveform C outputted from driver 12c (62c) is a pulse which falls earlier by 1 ns than a falling edge of waveform A. Accordingly, if waveform B and waveform C are latched at the rising edge of waveform A, then they become signals of "H" and "L", respectively.

Here, if only a resistor is inserted, the signals of waveform B and waveform C are distorted as seen in FIGS. 6D and 6E, respectively, and therefore, the waveforms cannot be latched correctly. On the other hand, where a capacitor is connected in parallel to the resistor in accordance with the present embodiment, the logic levels of waveform B and waveform C can be latched correctly although the potential level drops a little at rising and falling edges of waveform B and waveform C, respectively, as seen in FIGS. 6B and 6C. Consequently, with the method of the present embodiment, semiconductor devices can be inspected correctly.

Figure 7:
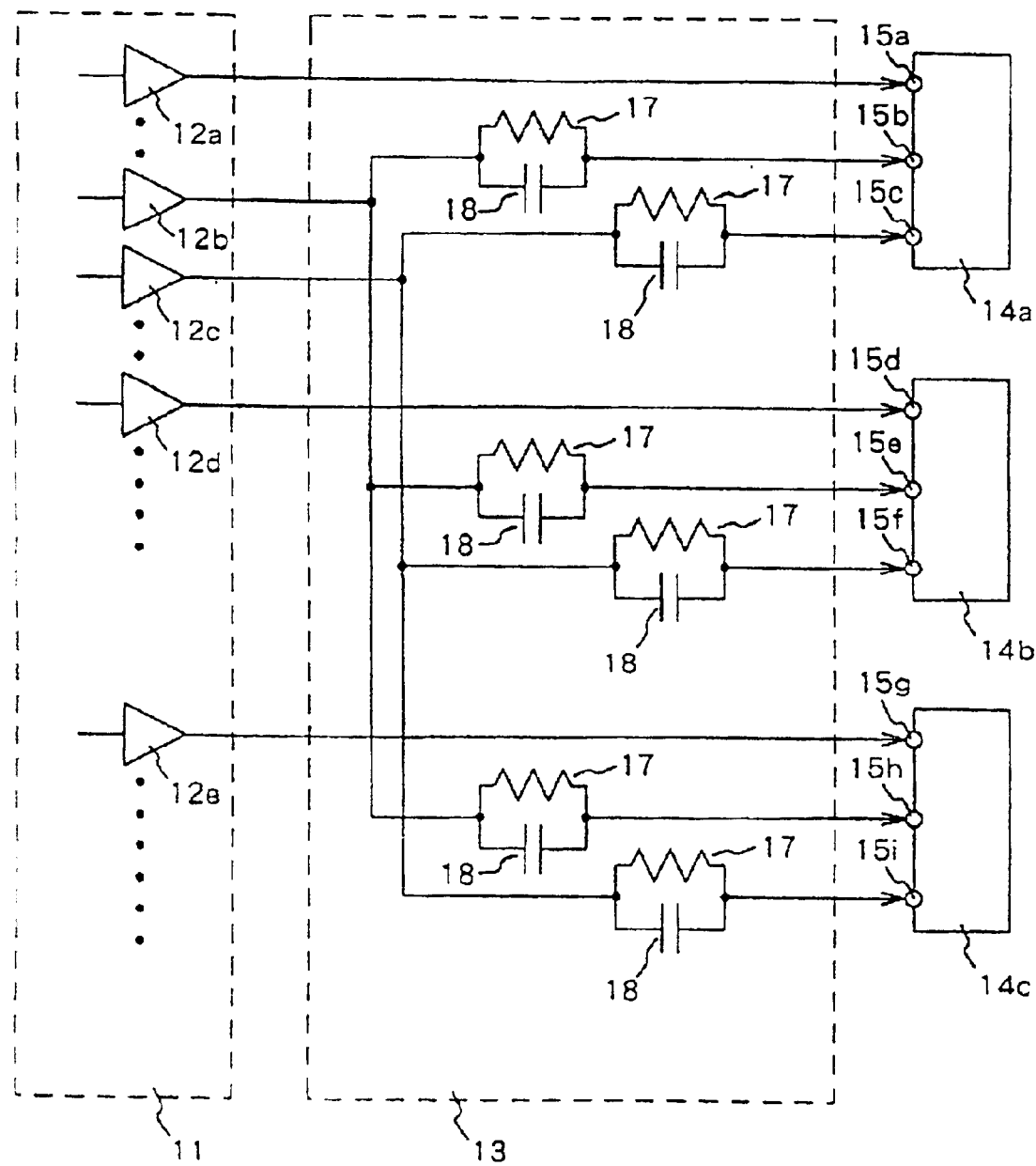
FIG. 7 is a circuit diagram showing a configuration of a semiconductor device inspection apparatus of another embodiment of the present invention.

While an embodiment of the present invention has been described, the present invention is not limited to the specific embodiment described above. The number of branches from a driver in the common drive wiring, for example, is not limited to 2 and may be 3 or more. FIG. 7 shows an example wherein the number of branches of a common drive wiring line is 3.

The configuration shown in FIG. 7 is a modification to the configuration shown in FIG. 5 in that semiconductor device 14c having input terminal 15g to 15i is additionally provided as a semiconductor device of the inspection object. The output of driver 12e in tester 11 is connected one by one to terminal 15g of semiconductor device 14c while the output of driver 12b is connected to terminal 15h, and the output of driver 12c is connected to terminal 15i. Naturally, resistor 17 is interposed between the branching point and each terminal in probe card 13, and capacitor 18 is connected in parallel to resistor 17.

While an example having three branches is just described, also any common driving wiring line that has four or more branches is naturally included in the scope of the present invention.

Figure 8:
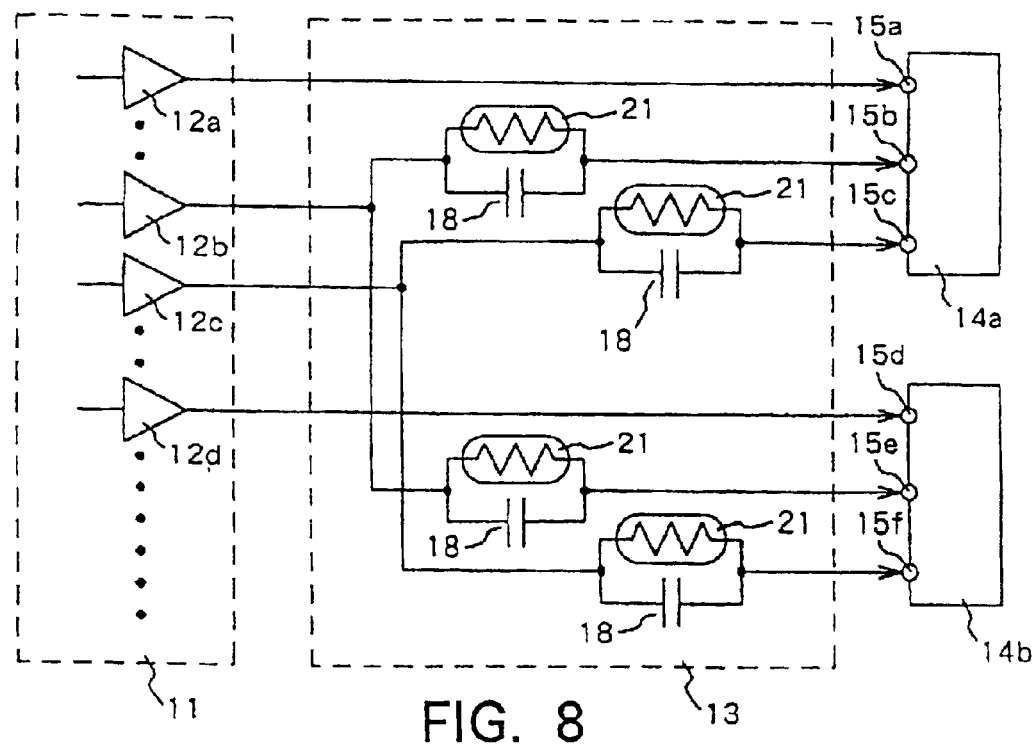
FIG. 8 is a circuit diagram showing a configuration of a semiconductor device inspection apparatus of a further embodiment of the present invention.

Further, in the present invention, various elements can be used as a current limiting element. FIG. 8 shows an example wherein thermistor 21 is used in place of each resistor in the configuration show in FIG. 5. Since a leak defect of an inputting terminal is a dc defect, use of a thermistor having a positive temperature coefficient can raise the effective resistance value as viewed from the driver to the terminal with which the leak defect occurs and can lower the effective resistance value as viewed from the driver to a normal terminal. Consequently, the influence of a terminal with which leak occurs upon the other normal terminals can be suppressed to the minimum, and the resistance value of the resistor inserted for each normal terminal can be suppressed low thereby to minimize the delay amount of a signal at each normal terminal.

Figure 9:
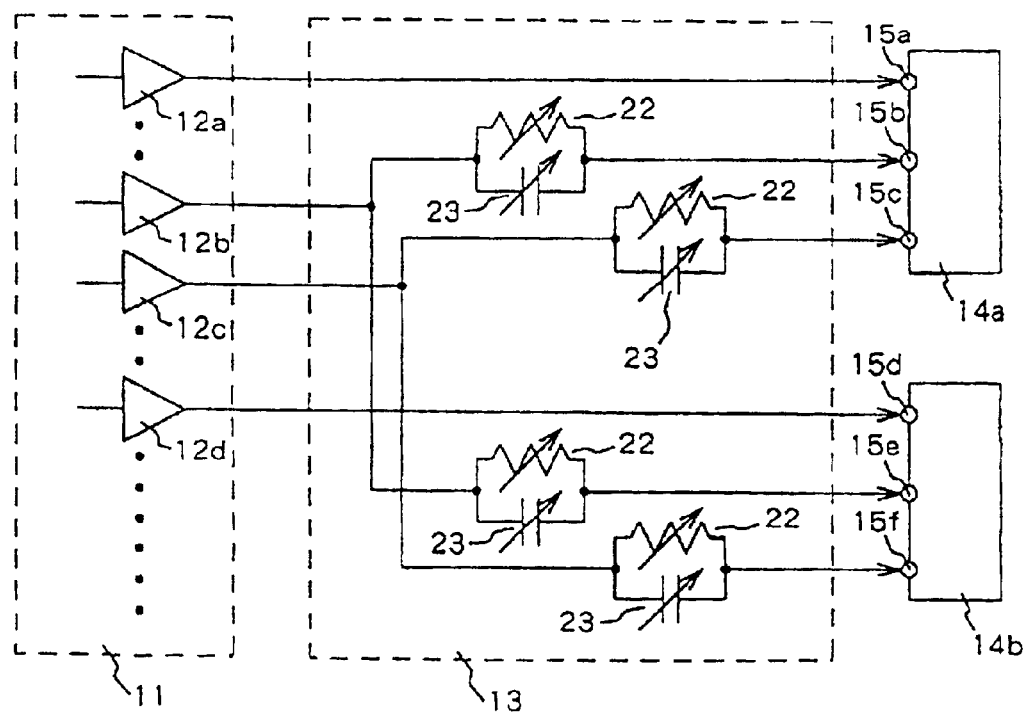
FIG. 9 is a circuit diagram showing a configuration of a semiconductor device inspection apparatus of a still further embodiment of the present invention.

In the configuration described above, a fixed resistor is interposed between a branching point and a terminal of a semiconductor device to be inspected, and a fixed capacitor is connected in parallel to the fixed resistor. However, a variable resistor and a variable capacitor (variable capacitance) may be used instead, respectively. FIG. 9 shows an example which is a modification to the configuration shown in FIG. 5 in that variable resistor 22 is used in place of each resistor and variable capacitor 23 is used in place of each capacitor. Where a variable resistor and a variable capacitor are used in this manner, an optimum resistance value and/or capacitance value can be selected in accordance with the electric characteristic of an input terminal of a semiconductor device to be inspected, the clock frequency, or the driving capacity of the drivers.

As described above, according to the present invention, delay or distortion of a signal applied to an input terminal of a semiconductor device upon inspection can be suppressed with a simple circuit configuration without being influenced by another defective semiconductor device connected simultaneously. Consequently, a large number of semiconductor devices whose clock frequency is as high as 10 MHz or more such as semiconductor devices whose clock frequency is 66 MHz or 133 MHz, for example, can be inspected simultaneously.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. An inspection method for simultaneously inspecting a plurality of semiconductor devices each having a respective input terminal for receiving an input signal, the method comprising:

preparing a first driver for outputting a signal to be used for inspection of a plurality of semiconductor devices;

connecting an output terminal of said first driver to a branching point;

connecting the respective input terminals of each of the plurality of semiconductor devices and the branching point through a current limiting element and a capacitor, said capacitor being connected in parallel to said current limiting element;

outputting said signal from said first driver toward said branching point and;

preparing a second driver for outputting a signal to be used for inspection of a single device;

connecting an output terminal of the second driver to an input terminal of the single device and;

outputting the signal from the second driver toward the input terminal of the single device.

2. An inspection method according to claim 1, wherein a resistor is used as said current limiting element.

3. An inspection method according to claim 2, wherein resistance value of said resistor is set equal to or higher than 10 Ω.

4. An inspection method according to claim 1, wherein capacitance value of said capacitor is set equal to or higher than input capacitance value of the terminal to be connected.

5. An inspection method according to claim 1, wherein dc input resistance value of each of the terminals is equal to or higher than 0.1 MΩ.

6. An inspection method according to claim 1, wherein the semiconductor devices operate in synchronism with an external clock, and frequency of the external clock is equal to or higher than 10 MHz.

7. An inspection method for simultaneously inspecting a plurality of semiconductor devices each having a first terminal and a second terminal for receiving an input signal, the method comprising:

preparing a first driver for outputting a first signal to be used for inspection;

preparing a plurality of second drivers for outputting a second signal to be used for inspection;

connecting an output terminal of said first driver to a branching point;

connecting each of the first terminals of the semiconductor devices and the branching point through a current limiting element and a capacitor, said capacitor being connected in parallel to said current limiting element;

connecting output terminals of said plurality of second drivers and the second terminals to each other; and outputting said first signal from said first driver toward said branching point and outputting said second signal from said plurality of second drivers to said second terminals.

8. An inspection method according to claim 7, wherein a resistor is used as said current limiting element.

9. An inspection method according to claim 8, wherein resistance value of said resistor is set equal to or higher than 10 Ω.

10. An inspection method according to claim 7, wherein capacitance value of said capacitor is set equal to or higher than input capacitance value of the terminal to be connected.

11. An inspection method according to claim 7, wherein dc input resistance value of each of the terminals is equal to or higher than 0.1 MΩ.

12. An inspection method according to claim 7, wherein the semiconductor devices operate in synchronism with an external clock, and frequency of the external clock is equal to or higher than 10 MHz.

13. An inspection method according to claim 12, wherein said external clock is supplied to the second terminals through the second drivers.

14. An inspection apparatus for simultaneously inspecting a plurality of semiconductor devices each having a respective input terminal for receiving an input signal, the inspection apparatus comprising:

a first and second driver for outputting a signal to be used for inspection;

a branching point to which an output terminal of said first driver is connected;

a current limiting element interposed between each of the respective input terminals of the semiconductor devices and said branching point;

a capacitor connected in parallel to each of the current limiting elements and a connection between an output terminal of the second driver and an input of the semiconductor device not connected to the first driver.

15. An inspection apparatus according to claim 14, wherein said branching point, the current limiting elements and the capacitors are provided in a probe card or a test board for connecting semiconductor device to be inspected to a tester.

16. An inspection apparatus according to claim 14, wherein said current limiting element is a resistor.

17. An inspection apparatus according to claim 16, wherein resistance value of said resistor is equal to or higher than 10 Ω.

18. An inspection apparatus according to claim 14, wherein capacitance value of said capacitor is equal to or higher than input capacitance value of the terminal to be connected.

19. An inspection apparatus according to claim 14, wherein said current limiting element is a thermistor.

20. An inspection apparatus according to claim 14, wherein said current limiting element is a variable resistor, and said capacitor is a variable capacitor.

21. An inspection apparatus for simultaneously inspecting a plurality of semiconductor devices each having a first terminal and a second terminal for receiving an input signal, the inspection apparatus comprising of:

a first driver for outputting a first signal to be used for inspection;

a plurality of a second drivers for outputting a second signal to be used for inspection;

a branching point to which an output terminal of said first driver is connected;

a current limiting element interposed between the first terminals of the semiconductor devices and said branching point; and a capacitor connected in parallel to said current limiting element;

wherein output terminals of said plurality of second drivers and the second terminals are connected to each other.

22. An inspection apparatus according to claim 21, wherein said branching point, the current limiting elements and the capacitors are provided in a probe card or a test board for connecting semiconductor device to be inspected to a tester.

23. An inspection apparatus according to claim 21, wherein said current limiting element is a resistor.

24. An inspection apparatus according to claim 22, wherein resistance value of said resistor is equal to or higher than 10 Ω.

25. An inspection apparatus according to claim 21, wherein capacitance value of said capacitor is equal to or higher than input capacitance value of the terminal to be connected.

26. An inspection apparatus according to claim 21, wherein said current limiting element is a thermistor.

27. An inspection apparatus according to claim 21, wherein said current limiting element is a variable resistor, and said capacitor is a variable capacitor.

28. An inspection apparatus according to claim 21, further comprising means for supplying a clock signal of a frequency equal to or higher than 10 MHz to said second terminals.

29. An inspection apparatus according to claim 21, wherein the second drivers supplies a clock signal of a frequency equal to or higher than 10 MHz to said second terminals.

* * * * *